(12) United States Patent
Huang et al.

(10) Patent No.: US 6,790,740 B2
(45) Date of Patent: Sep. 14, 2004

(54) PROCESS FOR FILLING POLYSILICON SEAM

(75) Inventors: Tse-Yao Huang, Taipei (TW); Tzu-Ching Tsai, Taichung Hsien (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/375,485

(22) Filed: Feb. 27, 2003

(65) Prior Publication Data

US 2004/0082137 A1 Apr. 29, 2004

(30) Foreign Application Priority Data

Oct. 25, 2002 (TW) ........................................ 91125201 A

(51) Int. Cl.⁷ ............................................. H01L 21/20
(52) U.S. Cl. ...................................................... 438/386
(58) Field of Search ........................... 438/44, 243, 361, 438/386, 387, 389, 430, 432, 657, 684, 758

(56) References Cited

U.S. PATENT DOCUMENTS

| | | | | |
|---|---|---|---|---|
| 5,824,580 A | * | 10/1998 | Hauf et al. | 438/243 |
| 6,426,253 B1 | * | 7/2002 | Tews et al. | 438/243 |
| 6,559,030 B1 | * | 5/2003 | Doan et al. | 438/432 |
| 6,576,565 B1 | * | 6/2003 | Gluschenkov et al. | 438/758 |
| 2003/0017675 A1 | * | 1/2003 | Chen et al. | 438/380 |

* cited by examiner

Primary Examiner—Erik J. Kielin
Assistant Examiner—Jennifer M. Dolan
(74) Attorney, Agent, or Firm—Quintero Law Office

(57) ABSTRACT

A process for filling a polysilicon seam. First, a semiconducting substrate or an insulating layer having a trench is provided, and a first polysilicon layer having a seam is filled in the trench. Next, the first polysilicon layer is etched to expose the seam. Next, a second polysilicon layer is formed to fill the top portion of the seam and close the seam.

9 Claims, 10 Drawing Sheets

PROCESS FOR FILLING POLYSILICON SEAM

BACKGROUND OF THE INVENTION

1. Field of the Invention

The present invention relates to a process for filling a polysilicon seam, and more particularly to a process for filling a polysilicon seam in trench capacitor fabrication.

2. Description of the Prior Art

Presently, the density of dynamic random access memory (DRAM) increases continuously. It is thus necessary to decrease the memory cell size and maintain adequate storage capacitance to normally operate DRAM. Therefore, in recent years, trench capacitors have been extensively used in DRAM. A trench capacitor includes a trench in a substrate and n$^+$-doped polysilicon filled in the trench to serve as an electrode plate for the capacitor. The n$^+$-dopant is diffused into the substrate beneath the trench bottom to form another electrode plate, referred to as a buried plate. A dielectric layer is disposed between these two plates, making up a trench capacitor.

FIGS. 1a to 1c are cross-sections illustrating the conventional process flow of fabricating a trench capacitor with greater design rule (for example, about 0.25 µm). First, referring to FIG. 1a, a pad oxide layer 112 is formed on a semiconducting substrate 100 by thermal oxidation. Then, a silicon nitride layer 114 is formed by chemical vapor deposition (CVD). Then, a BSG (boron silicate glass) layer (not shown) is formed by CVD. Then, photolithographic and etching techniques are performed to form patterned pad oxide layer 112, patterned silicon nitride layer 114, and patterned BSG layer. Then, the semiconducting substrate 100 uncovered by the BSG layer is etched downwardly, forming a trench 116 with a predetermined depth, for example, 6–8 µm.

Subsequently, referring to FIG. 1b, a silicon nitride layer 200 is formed on the inner wall of the trench 116 and on the surface of the substrate 100. Then, a polysilicon layer 300 is formed to fill the trench 116. Due to the width restriction of the trench 116, it is very difficult for the polysilicon layer 300 to enter into the bottom of the trench 116. Thus, a seam 400 is formed at a position below a depth $h_1$ (generally about 3 µm) from the surface of the substrate 100. Thus far, the semiconducting substrate 100, the dielectric layer 200, and the polysilicon layer 300 collectively make up the trench capacitor.

Subsequently, referring to FIG. 1c, the polysilicon layer 300 is etched back to a predetermined depth. Then, the silicon nitride layer 200 is removed by wet etching to leave a polysilicon layer 320 and a silicon nitride layer 220, which have a distance H (generally controlled to 1.5 µm) from the substrate 100 surface. The trench is divided into a top portion I where there is no polysilicon 320, and a bottom portion II where polysilicon 320 exists. The bottom portion II makes up a trench capacitor. In the top portion I, the substrate 100 is exposed to connect the trench capacitor to outer conducting lines. Since the seam 400 is located at a deep position and $h_1$ is far greater than H, the seam 400 is not exposed, thus not affecting reliability.

However, when the design rule is decreased, different situations occur. FIGS. 2a to 2c are cross-sections illustrating the conventional process flow of fabricating a trench capacitor with smaller design rule, for example, less than 0.125 µm (sub half-quarter). First, referring to FIG. 2a, a pad oxide layer 112 is formed on a semiconducting substrate 100 by thermal oxidation. Then, a silicon nitride layer 114 is formed by chemical vapor deposition (CVD). Then, a BSG (boron silicate glass) layer (not shown) is formed by CVD. Then, photolithographic and etching techniques are performed to form patterned pad oxide layer 112, patterned silicon nitride layer 114, and patterned BSG layer. Then, the semiconducting substrate 100 uncovered by the BSG layer is etched downwardly, forming a trench 120 with a predetermined depth, for example, 6–8 µm.

Subsequently, referring to FIG. 2b, a silicon nitride layer 250 is formed on the inner wall of the trench 126 and on the surface of the substrate 100. Then, a polysilicon layer 350 is formed to fill the trench 120. Please compare FIGS. 1b and 2b. In FIG. 2b, since the trench 120 is narrower than trench 116, it is much more difficult for the polysilicon layer 350 to enter into the bottom of the trench 120. Thus, the polysilicon layer 350 closes the seam 120 in a very high position and a seam 450 is formed at a position below a depth $h_2$ ($h_2 < h_1$, $h_2$ is generally less than about 1.5 µm) from the surface of the substrate 100. Thus far, the semiconducting substrate 100, the dielectric layer 250, and the polysilicon layer 350 collectively make up the trench capacitor.

Subsequently, referring to FIG. 2c, the polysilicon layer 350 is etched back to a predetermined depth. Considering that the top portion of the trench 120 can connect to an outer conducting line, the polysilicon layer 350 must be etched to a position below a depth H (generally about 1.5 µm) from the surface of the substrate 100. Since H>$h_2$, after etching the polysilicon layer 350, the seam 450 is exposed. Then, the silicon nitride layer 250 is removed by wet etching. A polysilicon layer 380 and a silicon nitride layer 280 are left in the trench 120. Since the seam 450 is exposed, reliability problems occur.

SUMMARY OF THE INVENTION

An object of the present invention is to solve the above-mentioned problems and provide a process for filling a polysilicon seam to prevent reliability problems.

To achieve the above object, the present inventive process for filling a polysilicon seam includes the following steps. First, a semiconducting substrate or an insulating layer having a trench is provided, and a first polysilicon layer having a seam is filled in the trench. Next, the first polysilicon layer is etched to expose the seam. Next, a second polysilicon layer is formed to fill the top portion of the seam and close the seam.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 3a to 3g are cross-sections illustrating the process flow of filling a polysilicon seam according to a first embodiment of the present invention. This embodiment fills the polysilicon seam in a trench in a semiconducting substrate.

Figure 1A:
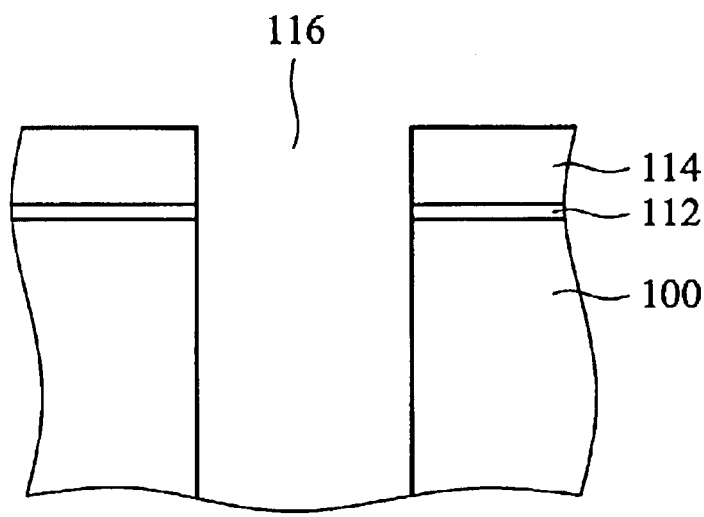
FIGS. 1a to 1c are cross-sections illustrating the conventional process flow of fabricating a trench capacitor with greater design rule.
Figure 1B:
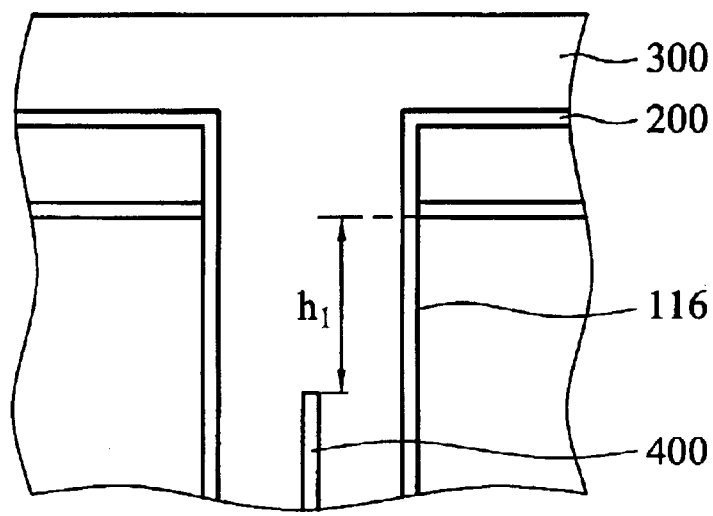
Figure 1C:
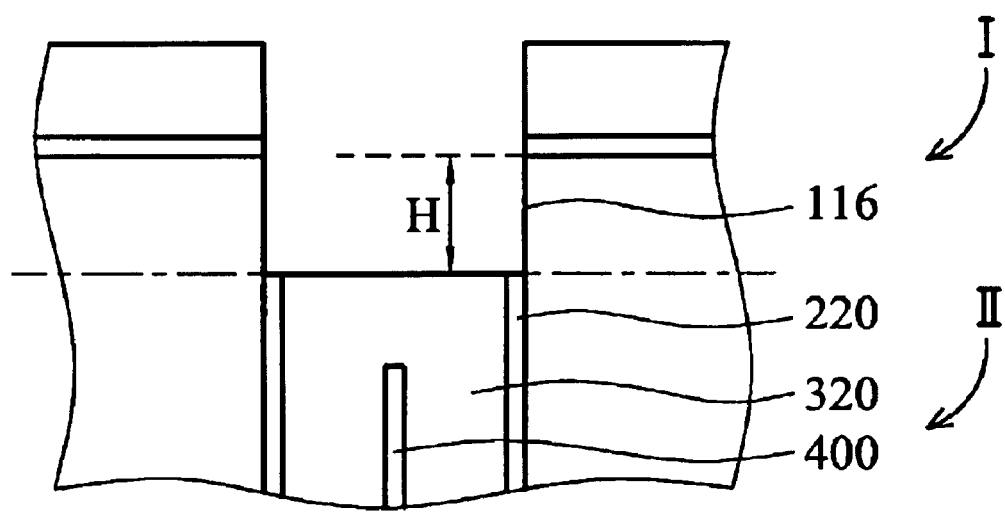
Figure 2A:
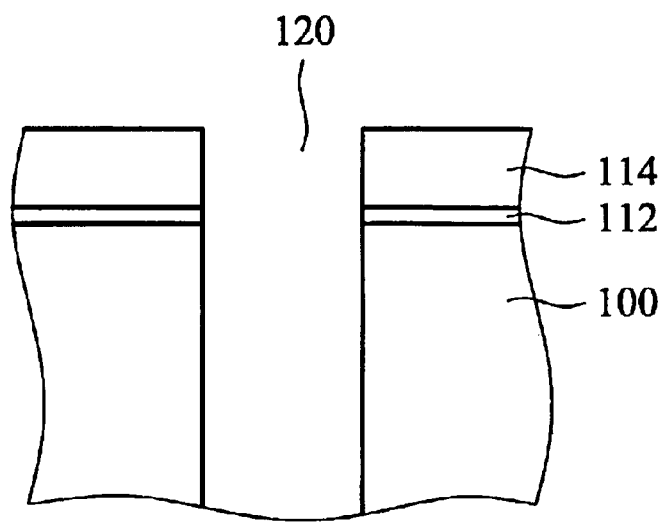
FIGS. 2a to 2c are cross-sections illustrating the conventional process flow of fabricating a trench capacitor with smaller design rule.
Figure 2B:
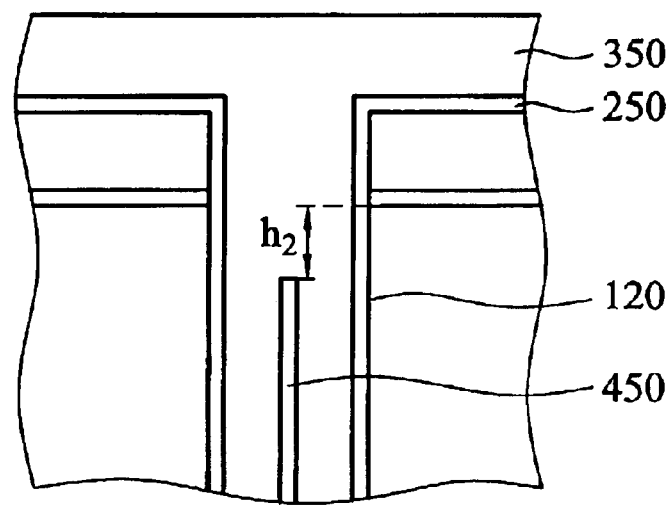
Figure 2C:
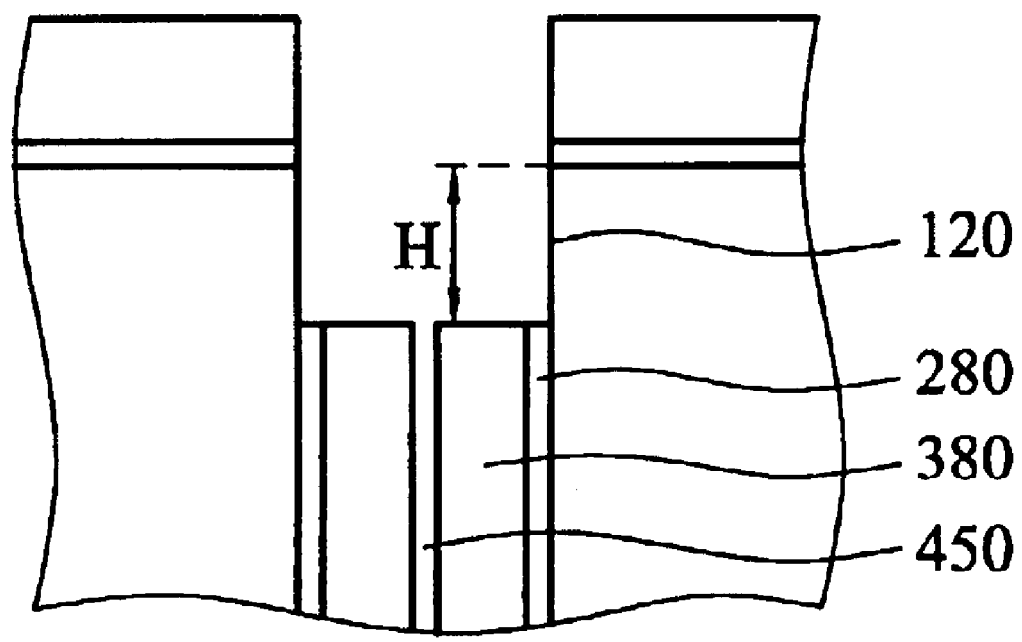
Figure 3A:
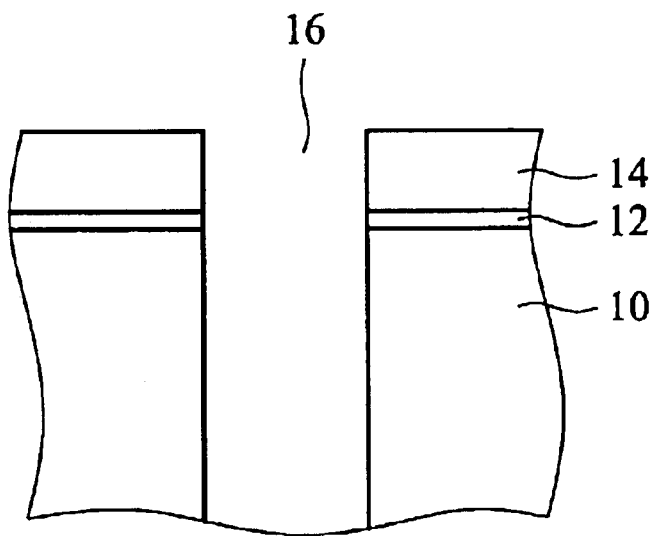
FIGS. 3a to 3g are cross-sections illustrating the process flow of filling the polysilicon seam in the trench in the semiconducting substrate according to a first embodiment of the present invention.

First, referring to FIG. 3a, a trench 16 is formed in a semiconducting substrate 10. The semiconducting substrate 10 can be a silicon substrate. For example, a pad oxide layer 12 is formed on the substrate 10 by thermal oxidation. Then, a silicon nitride layer 14 is formed by chemical vapor deposition (CVD). Then, a BSG layer (not shown) is formed by CVD. Then, photolithographic and etching techniques are performed to form patterned pad oxide layer 12, patterned silicon nitride layer 14, and patterned BSG layer. Then, the semiconducting substrate 10 uncovered by the BSG layer is etched downwardly, forming a trench 16 with a predetermined depth. For example, the semiconducting substrate 10 can be etched by anisotropic plasma etching using HBr, $NF_3$, $O_2$, and helium as reactant gases using the BSG layer as a mask. A trench 16 having a depth of about 6 to 8 µm is formed. Then, the BSG layer is removed.

Figure 3B:
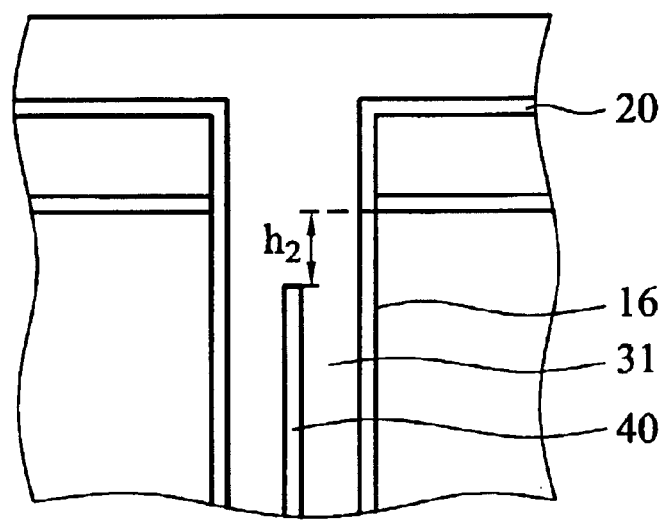

Subsequently, referring to FIG. 3b, a dielectric layer 20 is formed on the inner wall of the trench 16 and on the surface of the substrate 10. The dielectric layer 20 can be silicon nitride formed by CVD. Then, a first polysilicon layer 31 is formed on the dielectric layer 20 to fill the trench 16. For example, a doped first polysilicon layer 31 can be formed by low pressure CVD (LPCVD) and in-situ doping. For devices with a small design rule (for example, less than 0.125 µm), the trench 16 has very small width. Therefore, it is very difficult for the first polysilicon layer 31 to enter into the trench 16. The first polysilicon layer 31 closes the trench 16 at a high position and cannot enter into the bottom of the trench 16. Thus, a seam 40 is formed at a position below a depth $h_2$ (generally smaller than 1.5 µm) from the surface of the substrate 10. Thus far, the semiconducting substrate 10, the dielectric layer 20, and the first polysilicon layer 31 constitute a trench capacitor.

Figure 3C:
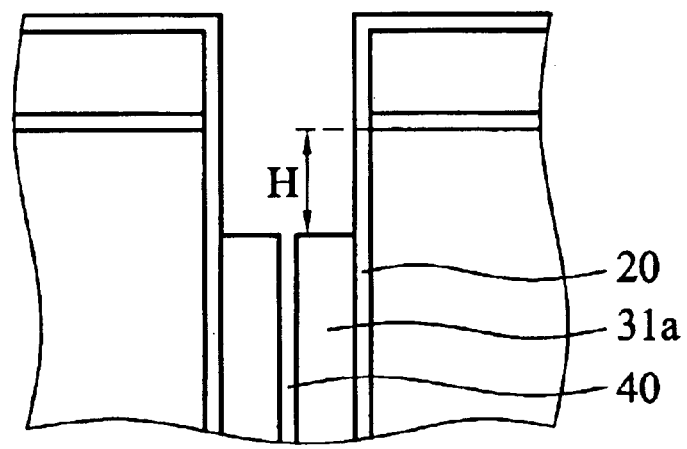

Subsequently, referring to FIG. 3c, the first polysilicon layer 31 is etched back to a predetermined depth. Considering that the top portion of the trench can connect to an outer conducting line, the first polysilicon layer 31 is etched to a position below a depth H (generally about 1.5 µm) from the surface of the substrate 10. The etching back of the first polysilicon layer 31 can be conducted by dry etching, specifically, using fluorine-containing gas plasma with a high selectivity of polysilicon to silicon oxide or silicon nitride, for example, $SF_6/CF_4/O_2$ plasma. Since $H>h_2$, after etching the polysilicon layer 31, the seam 40 is exposed. The first polysilicon layer left in the trench 16 is labeled as 31a.

Figure 3D:
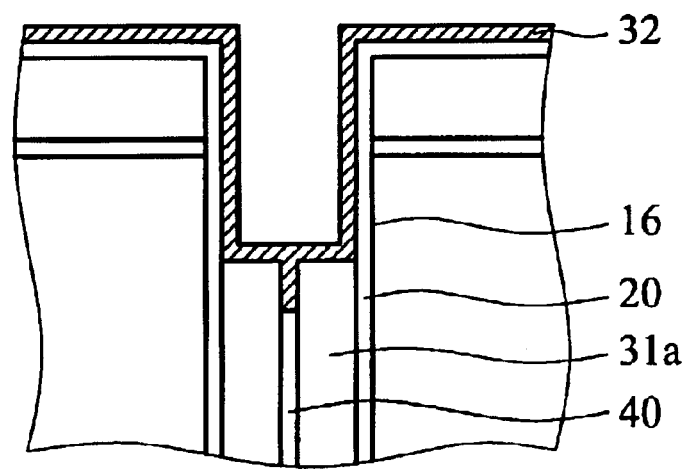

In order to prevent the reliability problem caused by the exposed seam 40, in the subsequent procedures, the present invention fills the seam 40 in the first polysilicon layer 31a. Referring to FIG. 3d, a second polysilicon layer is formed to fill the top portion of the seam 40 and close the seam 40. For example, a doped second polysilicon layer 32 is formed over the semiconducting substrate 10 by LPCVD and in-situ doping. The doped second polysilicon layer 32 forms on the surface of the semiconducting substrate 10 and on the inner wall of the trench 16, filling the top portion of the seam 40 to close the seam 40.

Figure 3E:
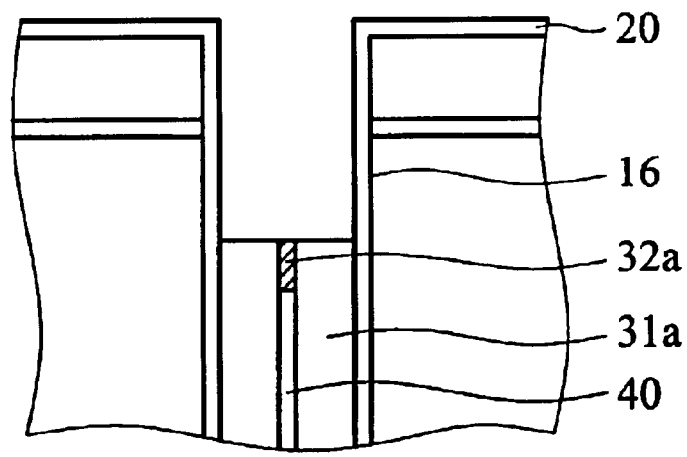

Subsequently, referring to FIG. 3e, etching back is performed to remove the second polysilicon layer 32 on the surface of the semiconducting substrate 10 and on the inner wall of the trench 16. The second polysilicon layer left is only on the top portion of the seam 40, labeled as 32a. The etching back of the second polysilicon layer 32 can be conducted by dry etching, specifically, using fluorine-containing gas plasma such as $SF_6/CF_4/O_2$ plasma with a high selectivity of polysilicon to silicon oxide or silicon nitride.

Figure 3F:
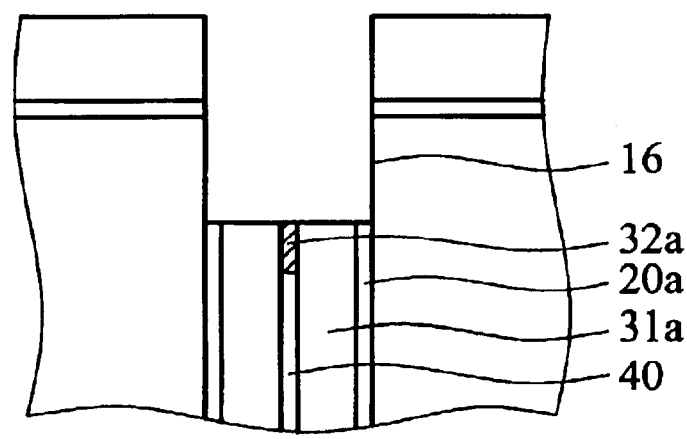

Subsequently, referring to FIG. 3f, the dielectric layer 20 exposed on the substrate 10 and on the inner wall of the trench 16 is removed, for example, by wet etching using $H_3PO_4$. The dielectric layer left in the trench is labeled to 20a.

Figure 3G:
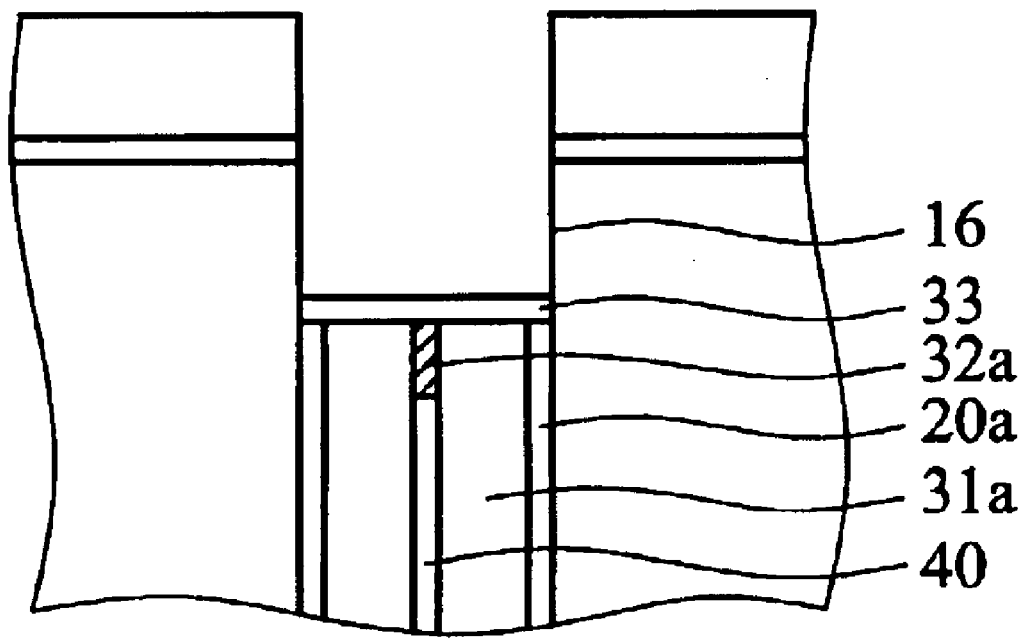

Subsequently, referring to FIG. 3g, a third polysilicon layer can be formed, according to requirements, on the entire surface of the semiconducting substrate 10 by LPCVD. Then, etching back is conducted by fluorine-containing gas plasma, forming a third polysilicon layer 33 on the first and second polysilicon layers 31a and 32a in the trench. In this way, the required total depth of the polysilicon layer in the trench can be adjusted using the thickness of the third polysilicon layer 33. Thus, when performing wire connection in the future, since the polysilicon seam is not exposed, no reliability problem occurs.

FIGS. 4a to 4d are cross-sections illustrating the process flow of filling a polysilicon seam according to a second embodiment of the present invention. This embodiment fills the polysilicon seam in a trench in an insulating layer.

Figure 4A:
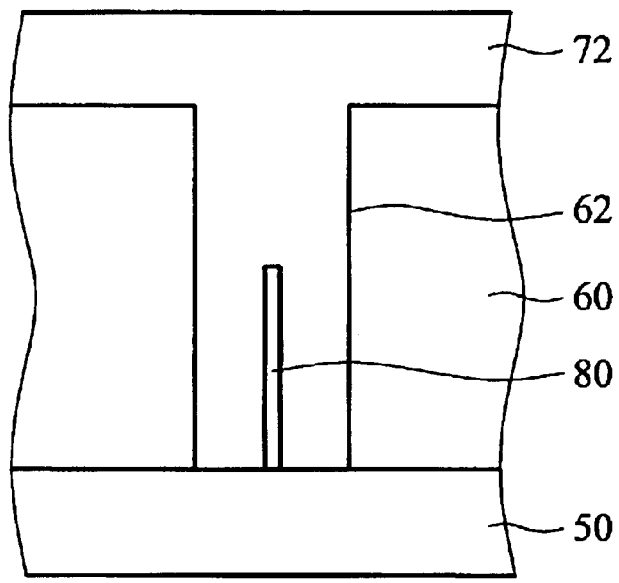
FIGS. 4a to 4d are cross-sections illustrating the process flow of filling the polysilicon seam in the trench in the insulating layer according to a second embodiment of the present invention.

First, referring to FIG. 4a, an insulating layer 60 is formed on a conducting layer 50. In order to connect the conducting layer 50 to the other conducting layer, a trench (contact window) is generally formed in the insulating layer 60, and then a conducting material is filled in the trench. Referring to FIG. 4a, a trench 62 is formed in the insulating layer 60 using photolithographic and etching techniques. Then, a first polysilicon layer 72 is formed over the entire surface of the insulating layer 60 to fill in the trench 62. For devices with a small design rule (for example, less than 0.125 µm), the trench 62 is very narrow. Therefore, it is very difficult for the first polysilicon layer 72 to enter into the trench 62. The first polysilicon layer 72 closes the trench 62 at a high position and cannot enter into the bottom of the trench 62. Thus, a seam 80 is formed at the bottom portion of the trench 62.

Figure 4B:
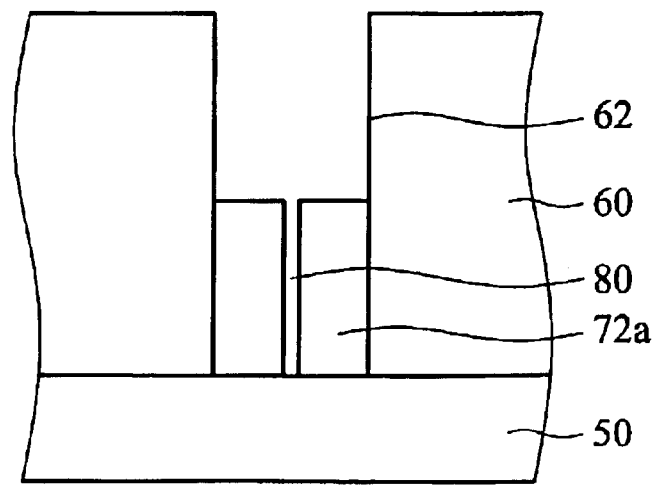

Subsequently, referring to FIG. 4b, the first polysilicon layer 72 is etched back to a predetermined depth to expose the seam 80. The first polysilicon layer left in the trench 62 is labeled to 72a.

Figure 4C:
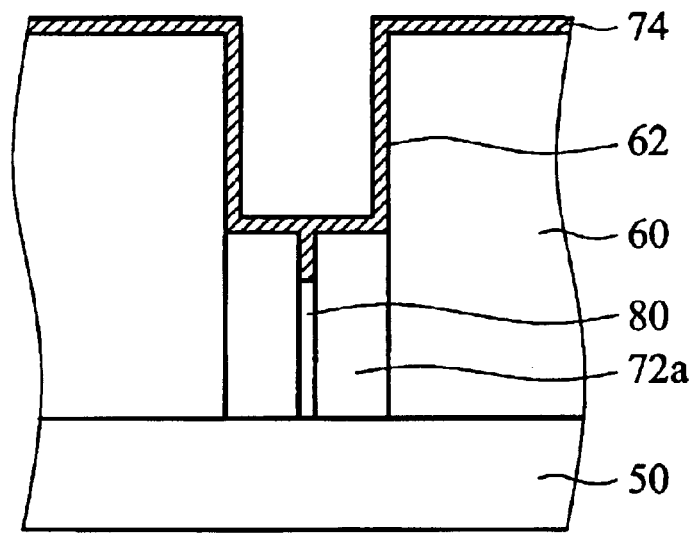

In order to prevent the reliability problem caused by the exposed seam 80, in the subsequent procedures, the present invention fills the seam 80 in the first polysilicon layer 72a. Referring to FIG. 4c, a second polysilicon layer is formed to fill the top portion of the seam 80 and close the seam 80. For example, a second polysilicon layer 74 is formed over the insulating layer 60 by LPCVD. The second polysilicon layer 74 forms on the surface of the insulating layer 60 and on the inner wall of the trench 62, filling the top portion of the seam 80 to close the seam 80.

Figure 4D:
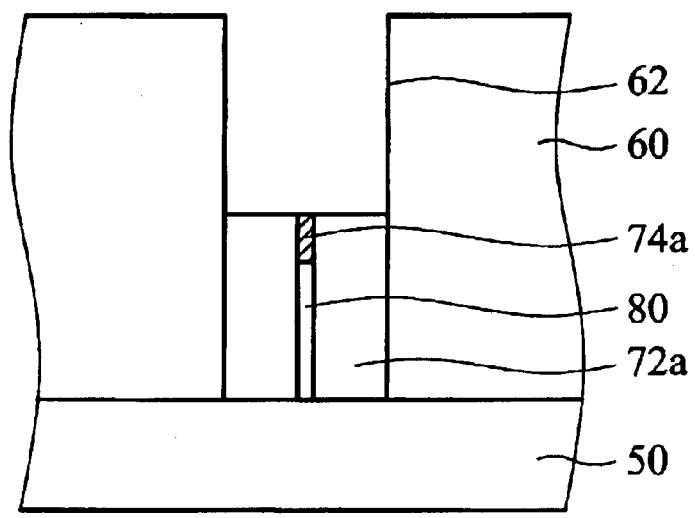

Subsequently, referring to FIG. 4d, etching back is performed to remove the second polysilicon layer 74 on the surface of the insulating layer 60 and on the inner wall of the trench 62. The second polysilicon layer left is only on the top portion of the seam 80, which is labeled to 74a. The etching back of the second polysilicon layer 74 can be conducted by dry etching, specifically, using fluorine-containing gas plasma such as $SF_6/CF_4/O_2$ plasma with a high selectivity of polysilicon to silicon oxide or silicon nitride. Next, a conducting layer (not shown), such as tungsten or polysilicon, can be formed according to requirements to fill the trench 62 for connection.

In conclusion, the present invention fills the polysilicon seam in the trench in the semiconducting substrate and also fills the polysilicon seam in the trench in the insulating layer. Thus, the reliability problem caused by the polysilicon seam can be prevented.

The foregoing description of the preferred embodiments of this invention has been presented for purposes of illustration and description. Obvious modifications or variations are possible in light of the above teaching. The embodiments chosen and described provide an excellent illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A process for filling a polysilicon seam, comprising the following steps:

providing a semiconducting substrate having a trench, into which a first polysilicon layer having a seam is filled, wherein a dielectric layer is disposed on an inner wall of the trench and the first polysilicon layer is disposed on a sidewall of the dielectric layer to fill the trench;

etching the first polysilicon layer to expose the seam;

forming a second polysilicon layer over a surface of the semiconducting substrate and on the sidewall of the dielectric layer in the trench to fill a top portion of the seam and close the seam;

removing the second polysilicon layer from the surface of the semiconducting substrate and from the inner wall of the trench, only leaving the second polysilicon layer at the top portion of the seam; and removing the dielectric lever exposed on the inner wall of the trench.

2. The process as claimed in claim 1, wherein etching of the first polysilicon layer is conducted by dry etching.

3. The process as claimed in claim 1, wherein the trench is located in a silicon substrate.

4. The process as claimed in claim 1, wherein the dielectric layer is silicon nitride.

5. The process as claimed in claim 1, wherein removal or the dielectric layer is conducted by wet etching.

6. The process as claimed in claim 5, further comprising forming a third polysilicon layer on the first and second polysilicon layers in the trench.

7. A process for filling a polysilicon seam, comprising the following steps:

providing an insulating layer having a trench, into which a first polysilicon layer having a seam is filled;

etching the first polysilicon layer to expose the seam;

forming a second polysilicon layer over a surface of the insulating layer and on an inner wall of the trench to fill a top portion of the seam and close the seam; and removing the second polysilicon layer from the surface of the insulating layer and from the inner wall of the trench, only leaving the second polysilicon layer at the top portion of the seam.

8. The process as claimed in claim 7, wherein the insulating layer is silicon oxide.

9. The process as claimed in claim 7, wherein the trench is a contact window.

\* \* \* \* \*